(12) United States Patent
Houston et al.

(10) Patent No.: US 11,621,574 B2
(45) Date of Patent: Apr. 4, 2023

(54) REGULATOR WITH HIGH SPEED NONLINEAR COMPENSATION

(71) Applicant: Intersil Americas LLC, Milpitas, CA (US)

(72) Inventors: M. Jason Houston, Cary, NC (US); Eric M. Solie, Durham, NC (US); Mehul D. Shah, Morrisville, NC (US)

(73) Assignee: Intersil Americas LLC, Milpitas, CA (US)

( * ) Notice: Subject to any disclaimer, the term of this patent is extended or adjusted under 35 U.S.C. 154(b) by 519 days.

(21) Appl. No.: 16/859,925

(22) Filed: Apr. 27, 2020

(65) Prior Publication Data

US 2020/0259352 A1    Aug. 13, 2020

Related U.S. Application Data

(63) Continuation of application No. 15/062,348, filed on Mar. 7, 2016, now Pat. No. 10,637,266.

(Continued)

(51) Int. Cl.
*H02J 7/00* (2006.01)
*H03K 5/08* (2006.01)
(Continued)

(52) U.S. Cl.
CPC .............. *H02J 7/0068* (2013.01); *H02J 7/02* (2013.01); *H02M 3/156* (2013.01); *H03K 5/08* (2013.01); *H02J 2207/20* (2020.01)

(58) Field of Classification Search
CPC .................................................. H02J 7/0068
(Continued)

(56) References Cited

U.S. PATENT DOCUMENTS 5,949,210 A * 9/1999 Gataric ................. B60L 15/025
                                                         318/609
6,445,980 B1    9/2002 Vyers
(Continued)

FOREIGN PATENT DOCUMENTS

CN          1371490 A      9/2002
CN          1728520 A      2/2006
(Continued)

OTHER PUBLICATIONS

First Office Action and Search Report in CN Application No. 201610375100.1, dated May 24, 2017, 14 pages (English Translation).

(Continued)

*Primary Examiner* — Eric D Lee
(74) *Attorney, Agent, or Firm* — Foley & Lardner LLP (57) ABSTRACT

An apparatus including a proportional gain circuit, an integral gain circuit, a limit circuit, a gain booster circuit and a combiner. The gain circuits apply a proportional gain and an integral gain to an error signal, and the combiner combines both gained error signals to provide a control signal. The limit circuit applies a limit function that limits the proportional gain to a magnitude. The gain booster circuit increases gain while the limit function is being applied. The increased gain may be applied to only the integral gain, or to both the integral and proportional gains such as by boosting gain of the error signal. The apparatus may be a regulator that may include multiple control loops providing multiple error signals, in which a mode selector selects one of the error signals to control regulation. The limit function increases stability while the boosted gain improves transient response during mode transitions.

20 Claims, 5 Drawing Sheets

Related U.S. Application Data (60) Provisional application No. 62/219,764, filed on Sep. 17, 2015, provisional application No. 62/217,237, filed on Sep. 11, 2015, provisional application No. 62/169,189, filed on Jun. 1, 2015.

(51) Int. Cl.
*H02M 3/156* (2006.01)
*H02J 7/02* (2016.01)

(58) Field of Classification Search
USPC .......................................................... 320/145
See application file for complete search history.

(56) References Cited

U.S. PATENT DOCUMENTS

| | | |
|---|---|---|
| 2006/0022658 A1 | 2/2006 | Harriman et al. |
| 2014/0268909 A1 | 9/2014 | Digiacomo et al. |

FOREIGN PATENT DOCUMENTS

| | | |
|---|---|---|
| CN | 203084589 U | 7/2013 |
| CN | 104052270 A | 9/2014 |
| CN | 104137409 A | 11/2014 |
| JP | H09-312978 A | 12/1997 |
| JP | H11-008936 A | 1/1999 |

OTHER PUBLICATIONS

First Office Action for TW Application No. 105117027 dated Dec. 6, 2019, 6 pages (No English translation).

\* cited by examiner

REGULATOR WITH HIGH SPEED NONLINEAR COMPENSATION

CROSS-REFERENCE TO RELATED APPLICATIONS

The present application is a continuation of U.S. patent application Ser. No. 15/062,348 filed Mar. 7, 2016, now U.S. Pat. No. 10,637,266, which claims the benefit of U.S. Provisional Application No. 62/169,189, filed on Jun. 1, 2015, U.S. Provisional Application No. 62/217,237, filed on Sep. 11, 2015, and U.S. Provisional Application No. 62/219,764, filed on Sep. 17, 2015, all of which are hereby incorporated by reference in their entireties for all intents and purposes.

BRIEF DESCRIPTION OF THE DRAWINGS

The benefits, features, and advantages of the present invention will become better understood with regard to the following description and accompanying drawings, in which.

DETAILED DESCRIPTION

In battery charger systems, multiple control loops may be included for each of multiple operating modes depending upon the operating conditions. A first mode may be provided to control the output voltage, a second mode may be provided to control battery charging current, and additional modes may be provided to control either one of input current or input voltage. The battery charger system may incorporate a converter, which may be implemented according to a buck converter, a boost converter, or a buck-boost converter. Each operating mode applies to each of the converter types. Loop compensation is provided for each of the control loops to maintain stability while providing sufficient transient speed. Only one control loop mode is active at a given time, in which the system changes between the different operating modes in response to corresponding changes of the operating conditions.

Proportional and integral compensators are common in control systems. The gains of both the proportional compensator and the integral compensator may be set according to a tradeoff between stability and load transient speed. For example, a high gain may provide very fast response to an output load transient, but may also lead to instability of the control system, whereas a low gain may provide greater stability but insufficient response to load transients. In the battery charger configurations, the error signal applied to the proportional and integral compensators may be changed when changing between operating modes. If the proportional gain is too high, it may cause "chatter" when switching from one control loop to another. The chatter problem generally means that the system bounces between the multiple operating modes resulting in system instability. The proportional gain may be limited to avoid chatter issues, but may result in insufficient transient response.

A regulator with high speed nonlinear compensation as described herein limits the proportional compensator gain and increases one or both of the proportional compensator gain and the integral compensator gain during the limit condition. In this manner, the regulator achieves fast transient response while allowing smooth mode transition by avoiding mode oscillation or chatter when switching between the different control modes.

Figure 1:
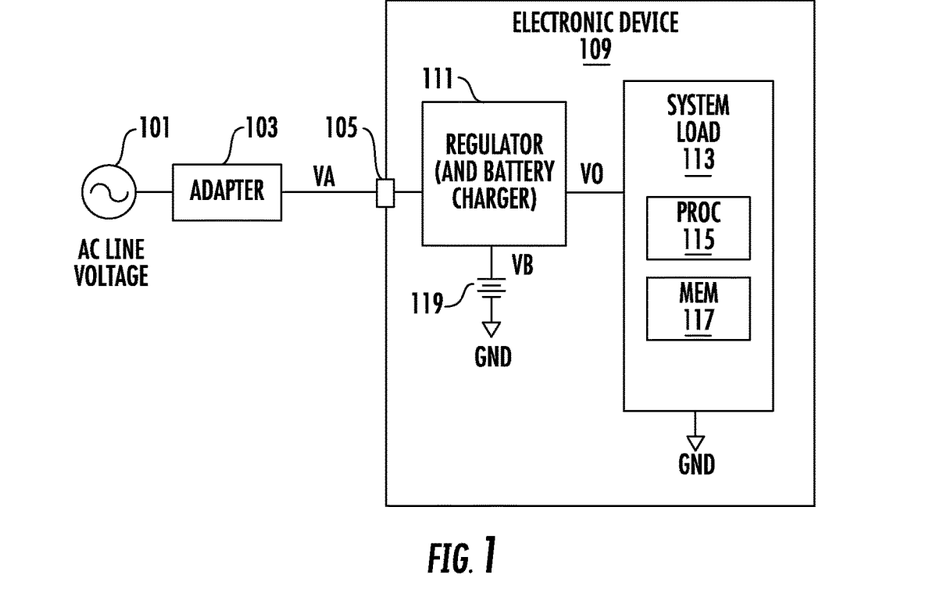
FIG. 1 is a simplified block diagram of an electronic device including a regulator implemented according to one embodiment of the present invention.

FIG. 1 is a simplified block diagram of an electronic device 109 including a regulator 111 implemented according to one embodiment of the present invention. The regulator 111 incorporates battery charger functions for charging a rechargeable battery 119. An AC line voltage shown at 101 is provided to the input of a power adapter 103, which converts the AC voltage to a DC adapter voltage VA. The voltage level of VA and the current capacity of the power adapter 103 should be suitable for providing sufficient power to the electronic device 109. Many different types of electronic devices are contemplated. The regulator 111 includes high speed nonlinear compensation which limits the proportional compensator gain and increases one or both of the proportional compensator gain and the integral compensator gain during the limit condition. In this manner, the regulator 111 achieves fast transient response while allowing smooth mode transition by avoiding mode oscillation or chatter when switching between the different control modes.

VA is shown provided by a suitable connection 105 to an input of the regulator 111, which provides an output voltage VO to a system load 113. The rechargeable battery 119 provides a battery voltage VB to another input of the power interface 111 for developing VO when the power adapter 103 is not available. In some configurations, the regulator 111 may allow current from the battery 119 to supplement current from the power adapter 103 to increase output current during high load conditions. The battery 119 and the system load 113 are shown referenced to ground (GND), where is it understood that GND is a reference node that generally represents any suitable positive or negative voltage level and/or multiple ground types, such as power ground, signal ground, analog ground, chassis ground, etc.

The electronic device 109 may be any type of electronic device, including mobile, portable, or handheld devices, such as, for example, any type of personal digital assistant (PDA), personal computer (PC), portable computer, laptop computer, etc., cellular phone, personal media device, etc. The primary functions of the electronic device 109 are performed by the system load 113, which may include one or more different system load elements. In the illustrated embodiment, the system load 113 includes a central processing unit (CPU) or processor 115, such as a microprocessor or controller or the like, which is coupled to any combination of any type of memory 117 commonly used for electronic devices, such as various types and configurations of random access memory (RAM) and read-only memory (ROM) and the like.

Figure 2:
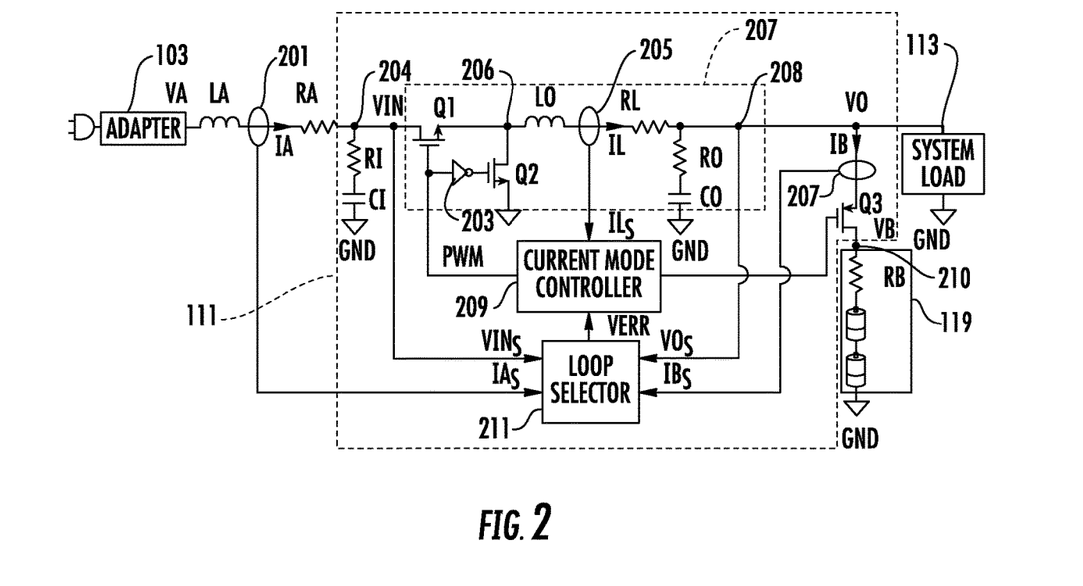
FIG. 2 is a more detailed schematic and block diagram of the regulator of FIG. 1 according to one embodiment, in which the regulator is coupled between the power adapter and the system load and further coupled to the battery.

FIG. 2 is a more detailed schematic and block diagram of the regulator 111 according to one embodiment, in which the regulator 111 is coupled between the power adapter 103 and the system load 113 and further coupled to the battery 119. The adapter voltage VA is shown provided through an adapter interface 202 including an input inductor LA and a resistor RA to an input node 204 developing an input voltage VIN. RA and LA are not physical devices but instead represent the parasitic resistance and inductance of the connection 105 between the power adapter 103 and the regulator 111. A sensed version of VIN, shown as VINS, is provided to a loop selector 211. A current detector 201 detects input adapter current IA and provides a current sense signal IAS to the loop selector 211. An input resistor RI and capacitor CI are coupled in series between the input node 204 and GND. The input node 204 is coupled to one current terminal of an electronic switch Q1, having its other current terminal coupled to a phase node 206 and its control terminal receiving, or otherwise controlled by, a pulse width modulation (PWM) signal. PWM is a pulse control signal provided through an inverter 203 to control the control terminal of another electronic switch Q2, having its first current terminal coupled to the phase node 206 and its second current terminal coupled to GND. The PWM signal is provided by a current mode controller 209.

The phase node 206 is coupled to one end of an output inductor LO, having its other end coupled to one end of a resistor RL. The resistor RL is not a physical resistor but instead represents the internal parasitic impedance of the output inductor LO. The other end of the resistor RL, meaning the other end of the output inductor LO, is coupled to an output node 208 developing the output voltage VO provided to the system load 113. A sensed version of VO, shown as VOS, is provided to the loop selector 211. A current detector 205 senses the inductor current IL through the output inductor LO and provides a current sense signal ILS to the current mode controller 209. An output capacitor CO is coupled between the output node 208 and GND. A resistor RO, which is shown in series with the output capacitor CO, is not a physical resistor but instead represents the equivalent series resistance (ESR) or parasitic resistance of the output capacitor CO. The switches Q1 and Q2, the inductor LO and the capacitor CO collectively form a converter 207 that converts VIN to VO based on PWM. Another electronic switch Q3 has one current terminal coupled to the output node 208 and another current terminal coupled to the positive terminal of the battery 119. The connection between the battery 119 and the electronic switch Q3 comprises a battery node 210. The negative terminal of the battery 119 is coupled to GND. A resistor RB, which is shown in series with the battery 119, is not a physical resistor but instead represents the internal resistance of the battery 119. Another current detector 207 senses battery current D3 and provides a battery current sense signal IBS to the loop selector 211. The loop selector 211 provides an error signal VERR, that is selected from among several possible error signals as described in more detail below, to another input of the current mode controller 209.

In general operation, the current mode controller 209 monitors the error signal VERR and the inductor current IL and generates the PWM signal to control switching of the regulator 111. When PWM is asserted high, Q1 is turned on and Q2 is turned off to apply VIN to the inductor LO to increase current through the inductor LO from input to output. When PWM is asserted low, Q1 is turned off and Q2 is turned on to terminate the power phase for the rest of the cycle. Operation repeats in this manner with sequential cycles of PWM. The current mode controller 209 also controls the electronic switch Q3 to control the battery current IB. The electronic switch Q3 may be turned on at a low level to trickle charge a deeply discharged battery 119, may be operated in a linear mode to control battery charging, and may be turned fully off when the battery 119 is fully charged. Also, the electronic switch Q3 may be turned fully on to discharge the battery into the system load 113, such as when the power adapter 103 is not connected.

The loop selector 211 determines which of the parameters, VO (regulator output voltage), VIN (limit adapter input voltage), IA (limit adapter input current) or IB (battery charging current) is used to develop the error signal VERR provided to the current mode controller 209 to control the loop. In one embodiment, a loop error signal is developed for each of the signals VIN, VO, IA and IB, and the loop selector 211 selects one of the loop error signals as VERR for controlling the loop. Furthermore, the loop selector 211 may switch between each of the loop error signals corresponding to each of separate control loops for each of multiple control modes of operation. It is desired to switch between the control modes quickly without chatter between the modes and without corresponding instability of the loop.

Although the schematic and block diagram of the regulator 111 shown in FIG. 2 shows sufficient detail, it is understood that the diagram is simplified in which many details are not shown since not necessary for a full and complete understanding of the embodiments of the present invention. For example, the PWM signal may be provided to a driver circuit (not shown), which then drives the gates of the electronic switches Q1 and Q2 as controlled by the PWM signal. When PWM is high, Q1 is turned on and Q2 is turned off, and when PWM is low, Q2 is turned on while Q1 is turned off (as represented in simplified manner by the inverter 203). The driver circuit is implemented to ensure that Q1 and Q2 are not turned on at the same time during switching. Also, a discontinuous conduction mode (DCM) is contemplated in which both Q1 and Q2 are both off during a portion of PWM cycles during certain operating conditions, such as low load conditions.

The current mode controller 209 uses VERR and IL to generate the PWM signal to control the loop according to current mode control as understood by those of ordinary skill in the art. VERR represents the relative amount of error of a selected parameter, such as a selected one of VO (regulator output voltage), VIN (limit adapter input voltage), IA (limit adapter input current) and D3 (battery charging current), and the current mode controller 209 adjusts the duty cycle of PWM signal accordingly to control the inductor current IL.

The electronic switches Q1-Q3 are each represented as a field-effect transistor (FET) or a MOS transistor or the like, although alternative transistor or switch configurations and implementations are contemplated. The electronic switches Q1 and Q2 are shown in a simplified buck configuration, but may be operated as, or otherwise configured as, a buck converter, a buck-boost converter, and/or a boost converter depending upon the relative voltage levels. The current detectors 201, 205 and 207 may be configured using simple sense devices such as resistors are inductive devices (inductors or transformers) or the like, or other current sensing methods may be used.

Figure 3:
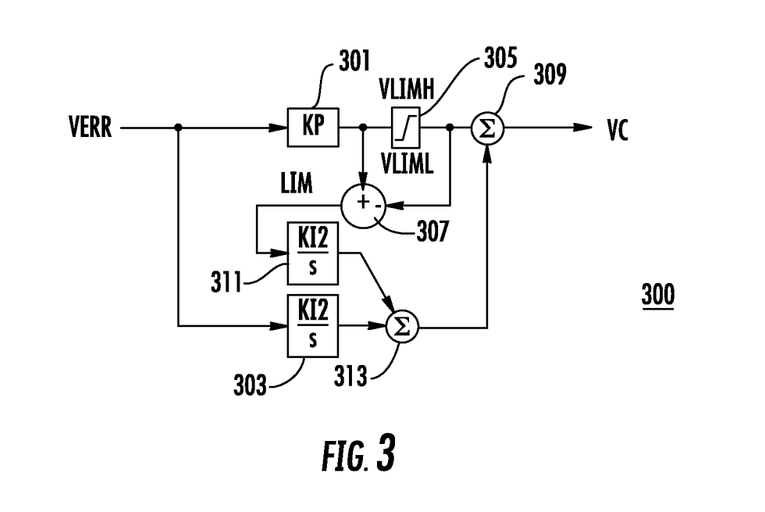
FIG. 3 is a block diagram illustrating a compensation system that may be used within the current mode controller of FIG. 2 to generate a control voltage VC based on the error voltage VERR according to one embodiment of the present invention.

FIG. 3 is a block diagram illustrating a compensation system 300 that may be used within the current mode controller 209 to generate a control voltage VC based on the error voltage VERR according to one embodiment of the present invention. Although not specifically shown, various methods may be used to convert VC to PWM as understood by those of ordinary skill in the art. As an example, VC and an oscillating signal (triangular waveform, saw-tooth waveform, etc.) may be compared using a comparator circuit having an output providing PWM. The comparator circuit may be implemented with hysteresis for implementing a hysteretic type controller. VERR is applied to an input of a proportional gain circuit 301 with proportional gain KP and to an input of an integral gain circuit 303 with an integral gain KI1/s, in which "s" denotes the s domain or complex frequency domain. The output of the proportional gain circuit 301 provides a proportional gain signal which is provided to an input of a limit circuit 305 and to the positive input of an adder 307. The limit circuit 305 receives the proportional gain signal and provides a limited proportional gain signal to one input of a summing circuit 309 and to a negative input of the adder 307. The output of the adder 307 provides a limit signal LIM, which is provided to an input of a gain booster circuit 311. In this case, the gain booster circuit 311 is another integral gain circuit with an integral gain KI2/s. The output of the integral gain circuit 303 provides an integral gain signal, and the output of the gain booster circuit 311 provides an extra or boost integral gain signal. The outputs of the integral gain circuits 303 and 311 are provided to respective inputs of another summing circuit 313, having its output provided to another input of the summing circuit 309. The output of the summing circuit 309 provides the control signal VC.

The gain circuits 301, 303 and 311 each apply a respective gain factor or function to its input to develop its output. The output of the limit circuit 305 generally follows its input up to a high predetermined limit VLIMH, or down to a low predetermined limit VLIML. The predetermined limits represent predetermined maximum magnitudes of the limited proportional gain signal. The proportional gain signal may rise above VLIMH while the limited proportional gain signal is effectively clamped at about VLIMH, or the proportional gain signal may fall below VLIML while the limited proportional gain signal is effectively clamped at about VLIML. When a difference develops between the proportional gain signal and the limited proportional gain signal, the limit circuit is applying a limit function to clamp the voltage of the limited proportional gain signal. The adder 307 subtracts the output of the limit circuit 305 from the output of the gain circuit 301 to develop the LIM signal. In this case, the LIM signal is a proportional limit signal having a magnitude that follows the difference between the proportional gain signal and the limited proportional gain signal. The summing circuits 309 and 313 generally operate as combiners that add the signals applied to their inputs to develop their outputs.

Figure 4:
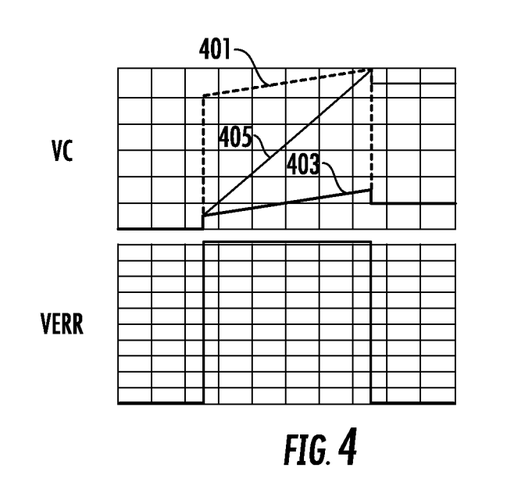
FIG. 4 is a set of simplified graphic diagrams illustrating the transfer characteristics of the compensation system of FIG. 3 to generate a control voltage in response to a large step increase of the selected loop error signal.

FIG. 4 is a set of simplified graphic diagrams illustrating the transfer characteristics of the compensation system 300 of FIG. 3 to generate VC in response to a large step increase of VERR. The lower graphic diagram depicts the step increase of VERR, and the upper graphic diagram illustrates the transfer characteristics of the compensation system 300 to generate VC in three different configurations in response to the step increase of VERR. It is noted that the large step increase of VERR may be due to a large increase of the output load, or may be due a switch from one operating mode to another. For example, the regulator 111 may be regulating the output voltage VO when a large load step transient causes a significant drop of the input voltage or surge of the input current. The loop selector 211 may switch to regulate the input voltage to prevent it from crashing too low, or to regulate the input current to prevent it from rising above the maximum current output of the power adapter 103.

A first configuration is illustrated by curve 401, depicting the transfer characteristic without the limit circuit 305 and without the gain booster circuit 311 (e.g., with the respective input and output of each of the circuits 305 and 311 shorted together). Thus, curve 401 depicts the effect of only the proportional gain circuit 301 and the integral gain circuit 303 summed together by the summing circuit 309. In this case, the response to the large step increase of VERR is fast and strong with a large magnitude. A benefit of this configuration is very fast transient response to the large change of VERR. A problem with this configuration is that the strong and fast response may lead to instability and chatter between the different operation modes when switching from one operating mode to another.

A second configuration is illustrated by curve 403, depicting the transfer characteristic of the proportional gain circuit 301, the integral gain circuit 303 and the limit circuit 305 to generate VC. This case is similar to the first configuration except that the limit circuit 305 is added to limit the response of the compensator. In this case, the response to the step increase of VERR is fast, but the amplitude is limited to VLIMH by the limit circuit 305 so that the response is not particularly strong. A benefit of this configuration is stability in which chatter and instability are substantially eliminated. A problem with this configuration is that much of the error information is stripped out by the limit circuit 305 so that the response is slower and less accurate.

A third configuration is illustrated by curve 405 in which all of the circuits are included and function accordingly including the gain booster circuit 311. In other words, the gain circuits 301, 303 and 311 and the limit circuit 305 contribute to the output VC. This case applies for strong and/or fast changes of VERR. In this case, the initial response is similar to the second configuration in which the limit circuit 305 reduces the initial response to the step increase of VERR based on VLIMH. However, a differential appears across the limit circuit 305 detected by the adder 307 to develop LIM provided to the input of the gain booster circuit 311. The LIM signal, which is based on the non-limited output of the proportional gain circuit 301, is applied to the second gain booster circuit 311 to effectively speed up the integral response of the compensation system 300. As shown, VC rises more quickly than the limited configuration (curve 403) to ultimately reach the response of the first configuration. This configuration provides both benefits, in which chatter is effectively eliminated and instability significantly reduced to provide a sufficiently fast and accurate response.

It is noted that for small and/or slow changes of VERR, the limit function performed by the limit circuit 305 may not be performed, so that the effects of the additional gain booster circuit 311 are removed from the circuit. Thus, the first configuration with the operation of only the proportional gain circuit 301 and the integral gain circuit 303 still applies for small or slow changes in the control loop. Whenever a change in VERR is fast or strong, the limit circuit 305 performs its limit function and the LIM signal is applied to the input of the gain booster circuit 311 to speed up the integral response.

Although not explicitly shown, the responses are substantially similar in the negative direction, such as in response to a large step decrease of VERR. Such a large step decrease also causes instability in the non-limited case. The limit-only case substantially eliminates the instability, but results in a slow response. The limit plus gain configuration reduces or otherwise eliminates instability while also providing a sufficiently fast and accurate response.

Figure 5:
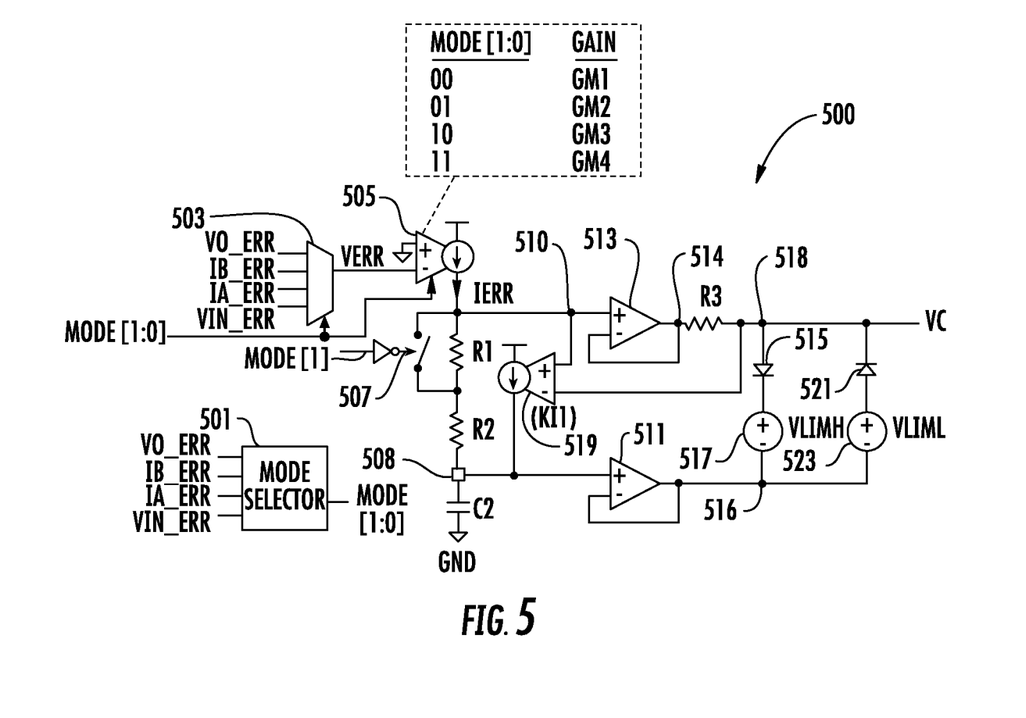
FIG. 5 is a schematic and block diagram illustrating a compensation circuit that implements the compensation system of FIG. 3 for generating the control voltage based on the selected loop error signal according to one embodiment.

FIG. 5 is a schematic and block diagram illustrating a compensation circuit 500 that implements the compensation system 300 of FIG. 3 for generating VC based on VERR according to one embodiment. A mode selector 501 monitors each of the error signals for each of the corresponding control loops for determining the mode of operation indicated by a 2-bit mode output, shown as the MODE[1:0] signal. The mode selector 501 may be provided within the loop selector 211 for selecting among multiple error signals to provide the selected error signal VERR to the current mode controller 209. The MODE[1:0] signal may also be provided to the current mode controller 209 for adjusting one or more gain factors as further described herein.

A first mode is for controlling the loop by regulating the output voltage VO based on a corresponding output voltage error VO_ERR (first loop error signal). This mode is used for normal operation when the battery 119 is not present or is otherwise fully charged, and when the load is within normal operating limits. In this case, a reference voltage is compared with a feedback signal indicative of VO (or VO itself), and the error signal VO_ERR indicates the deviation of VO with respect to the predetermined reference level.

A second mode is for controlling the loop by regulating the battery current IB according to a predetermined battery charge function to develop a battery current error IB_ERR (second loop error signal). This mode is also for normal operation when the battery 119 is connected and being charged and the load is within normal operating limits. In this case, the voltage of the battery 119 drives the output voltage VO and the loop regulates the battery charge current IB according to the charge function. For example, the switch Q3 may be controlled in a linear manner to control the charge current according to a particular charge current level or according to a particular charge function.

A third mode is for controlling the loop to limit the input current to a predetermined maximum level IA_MAX providing an input error signal IA_ERR (third loop error signal). If the IA_ERR becomes sufficiently high, the input current may exceed the current limit of the power adapter 103 so that it must be controlled to prevent damage to the power adapter 103 because of excessive current. In one embodiment, the adapter current limit is known and if the input current IA begins to approach or exceed the current limit IA_MAX, then IA_ERR becomes high and it is selected to control the loop.

A fourth mode is for controlling the loop to prevent the input voltage from dropping below a predetermined low level VIN_MIN providing an input voltage error VIN_ERR (fourth loop error signal). If the input voltage VIN becomes too low indicating that the voltage of the power adapter 103 may be too low, then the input voltage VIN may be regulated to ensure that it does not drop below the predetermined low level VIN_MIN. In some cases, the mode selector 501 detects one or both of the input current too high or input voltage too low indicating that the power adapter 103 is over-loaded. Whichever error parameter is greater is used to control the loop to protect the power adapter 103 and the electronic device 109 in general.

In summary, the mode selector 501 monitors the relative errors of the different operating parameters and determines which parameter needs to control the loop to achieve the desired result. The mode selector 501 asserts the MODE[1:0] signal accordingly. For example, MODE[1:0]=00b for selecting VO_ERR for regulating the output voltage VO, MODE[1:0]=01b for selecting IB_ERR for regulating the battery current IB, MODE[1:0]=10b for selecting IA_ERR for regulating the input current IA, and MODE[1:0]=11b for selecting VIN_ERR for regulating the input voltage VIN, where the appended "b" denotes a binary value. In the illustrated embodiment, each of the error signals VO_ERR, IB_ERR, IA_ERR and VIN_ERR are provided as voltage signals in which one is selected as the voltage error signal VERR. Alternative configurations are contemplated, such as current error signals or the like.

The MODE[1:0] signal is provided to the control input of select logic 503 to select one of the error signals VO_ERR, IB_ERR, IA_ERR and VIN_ERR for controlling the loop. The select logic 503 may be implemented in any suitable manner, such as a multiplexor (MUX). The selected error signal is output as VERR provided to the current mode controller 209. VERR is provided to one input (e.g., negative or inverting input) of an error amplifier 505 within the current mode controller 209, having its other input (e.g., positive or non-inverting input) coupled to GND. In this embodiment, the error amplifier 505 is configured as a transconductance amplifier with a transconductance gain generally denoted "GM." The gain of the error amplifier 505 is adjusted based on the MODE[1:0] signal to one of four corresponding gains GM1 (MODE[1:0]=00b), GM2 (MODE[1:0] =01b), GM3 (MODE[1:0] =10b) and GM4 (MODE[1:0]=11b) depending upon which operating mode is selected. The error amplifier 505 converts VERR to an error current IERR having a magnitude based on the magnitude of VERR and the selected gain.

IERR is provided through series resistors R1 and R2 and to a series capacitor C2 to GND. The resistors R1 and R2 are included for the input current and input voltage regulation modes. An inverted switch circuit 507 bypasses (shorts) the resistor R1 in either the output voltage or battery current regulation modes, so that only R2 is used for these modes. MODE[1] is the most significant bit of MODE[1:0] which is zero (or 0b) for the input current and input voltage regulation modes. The inverted switch circuit 507 is closed when MODE[1]=0b for the input current and input voltage regulation modes (to bypass R1), and is otherwise opened for the output voltage or battery current regulation modes (R1 plus R2).

IERR applied to the capacitor C2 implements the function of the integral gain circuit 303, in which the voltage of the capacitor C2 developed on an integral node 508 is provided to the positive input of a buffer amplifier 511. The output of the buffer amplifier 511 is coupled to a buffered integral node 516, which is also coupled to the negative input of the buffer amplifier 511. IERR applied through the resistors R1 and R2 (or just R2 when the inverted switch circuit 507 is closed) implements the function of the proportional gain circuit 301, in which the voltage developed on a summing node 510 is applied to the positive input of a buffer amplifier 513. The output of the buffer amplifier 513 is coupled to a buffered summing node 514, which is also coupled to the negative input of the buffer amplifier 513. A resistor R3 is coupled between node 514 and an output node 518 developing the control voltage VC. The buffer amplifiers 511 and 513 are generally configured as voltage followers with unity gain, although a different gain factor may be used.

Node 518 is further coupled to the anode of a diode 515, having its cathode coupled to the positive terminal of a voltage source 517 developing the upper limit voltage VLIMH. The negative terminal of the voltage source 517 is coupled to the output of the buffer amplifier 511 at a node 516. Also, node 518 is coupled to the cathode of a diode 521, having its anode coupled to the negative terminal of a voltage source 523 developing the lower limit voltage VLIMH. The positive terminal of the voltage source 523 is coupled to the output of the buffer amplifier 511 at a node 516.

Another transconductance amplifier 519 has its positive input coupled to summing node 510, its negative input coupled to control node 518, and its output providing a corresponding current to the integral node 508. The transconductance amplifier 519 develops a current at its output based on the difference between the voltages of the node 510 (non-limited proportional gain) and the node 518 (limited proportional gain), multiplies the voltage difference by its transconductance gain (simulating gain KI2) and generates a corresponding current to the capacitor C2.

The transconductor amplifier 505 generating the current IERR flowing into the capacitor C2 performs the function of the integral gain circuit 303 to develop an integral gain voltage on node 508. This voltage is buffered by the buffer amplifier 511 and asserted on node 516. Since the resistors R1 and R2 and the capacitor C2 are coupled in series, the proportional and integral gains add together on the summing node 510. The buffer amplifier 513 buffers this voltage onto node 514, which is the combined integral and non-limited gains.

The diodes 515 and 521 and the voltage sources 517 and 523 are clamp circuits that collectively perform the function of the limit circuit 305. In this case, when the voltage of VC relative to the voltage of node 516 (combined proportional and integral gains) rises above VLIMH, the diode 515 clamps VC at VLIMH above the voltage of node 516. Since the voltage of node 516 is the integral gain, the diode 515 and voltage source 517 limit the proportional gain to prevent the voltage between nodes 518 and 516 from significantly exceeding VLIMH. Also, when the voltage of VC relative to the voltage of node 516 falls below VLIML, the diode 521 clamps VC at VLIML below the voltage of node 516. Thus, the diode 521 and voltage source 523 form a negative limit voltage clamp. In other words, the limit function prevents the voltage VC on node 518 from rising significantly above the voltage of node 516 plus VLIMH and prevents VC from falling significantly below the voltage of node 516 minus VLIML. In this manner, the proportional gain portion is limited by the limit function. The magnitudes of VLIMH and VLIML may be the same, or may be different depending upon the circuit implementation. The resistor R3 isolates the non-limited proportional gain signal from the limited proportional gain signal.

The transconductance amplifier 519 providing its output current to the capacitor C2 performs the collective function of the adder 307 and the gain booster circuit 311 to increase the integral gain during the limit function. When the voltage of VC is within the proportional gain limits VLIMH and VLIML relative to the voltage of node 516, the voltages of nodes 510 and 518 are substantially equal so that the transconductance amplifier 519 does not output significant current and thus does not contribute to the integral gain. When the voltage of node 510 exceeds the voltage of VC at node 518 caused by clamping (VLIMH), the transconductance amplifier 519 provides a current proportional to the voltage difference to increase the positive integral gain. When the voltage of node 510 falls below the voltage of VC caused by clamping in the negative direction (VLIML), the transconductance amplifier 519 provides a current proportional to the voltage difference to increase the negative integral gain.

In operation of the compensation circuit 500, the loop selector 211 receives signals VIN, IA, VO and IB (or sensed versions thereof), develops each of the error signals VO_ERR, IB_ERR, IA_ERR and VIN_ERR, and controls the mode selector 501 to provide the MODE[1:0] signal based on the selected mode of operation. MODE[1:0] controls the select logic 503 to select one of the error signals VO_ERR, IB_ERR, IA_ERR and VIN_ERR as the selected error signal VERR for controlling the loop. The MODE[1:0] signal also adjusts the gain of the error amplifier 505 (selected one of gains GM1-GM4) based on the selected mode of operation. The error amplifier 505 drives IERR based on VERR and the selected gain to develop the voltage on node 510, which is buffered (and possibly limited) to develop the control voltage VC on node 518 to control the loop.

When changes of VERR are relatively slow, then the voltage on node 518 stays within VLIMH and VLIML of the voltage on node 516 so that the transconductance amplifier 519 does not contribute significantly to the gain applied to VC. In response to a fast change of VERR causing application of the VLIMH or VLIML limit function, a voltage differential is applied to the input of transconductance amplifier 519 causing an increase of the integral gain to compensate for the change of VERR. In particular, in response to the step increase function as shown in FIG. 4, the voltage of node 514 jumps above the voltage of node 516 by more than VLIMH, in which the diode 515 is forward biased to clamp VC. The transconductance amplifier 519 increases the positive integral gain by driving current into the capacitor C2 to increase the voltage of node 516. As the voltage of node 516 rises due to the contribution of IERR and the output of the transconductance amplifier 519 applied to the capacitor C2, the voltage rises more quickly such as shown by curve 405 in FIG. 4. In a similar manner, a fast decrease of VERR in the negative direction causing the voltage of node 514 to jump below the voltage of node 516 by more than VLIML forward biases the diode 521 to activate the negative limit function. The negative limit function causes a voltage differential applied to the input of the transconductance amplifier 519 to increase the negative integral gain by pulling current from the capacitor C2 to decrease the voltage of node 516.

Test results have shown that when the effects of the limit and gain functions performed by the diodes 515 and 521, the voltage sources 517 and 523 and the transconductance amplifier 519 are removed, the compensation circuit 500 exhibits substantial oscillation that results in a significant amount of chatter and instability in the system in response to the large step changes of VERR. When the limit circuit including the diodes 515 and 521 and the voltage sources 517 and 523 are added while the transconductance amplifier 519 is not included in the compensation circuit 500, the test results illustrate a relatively slow response in which the output voltage VO changes significantly (negative or positive) and the adapter current IA is slow to respond. Although oscillation has been virtually eliminated with addition of the limit function, the delay of VC and IA and the output voltage sag of VO are disadvantageous. Finally, when the limit function (including the diodes 515 and 521 and the voltage source 517 and 523) and the additional integral gain (transconductance amplifier 519) are all included, the test results reveal a relatively fast response for VC, VO and IA without significant change of the output voltage VO. In this manner, the complete compensation circuit 500 provides high speed nonlinear compensation to improve the overall response of the regulator 111.

Figure 6:
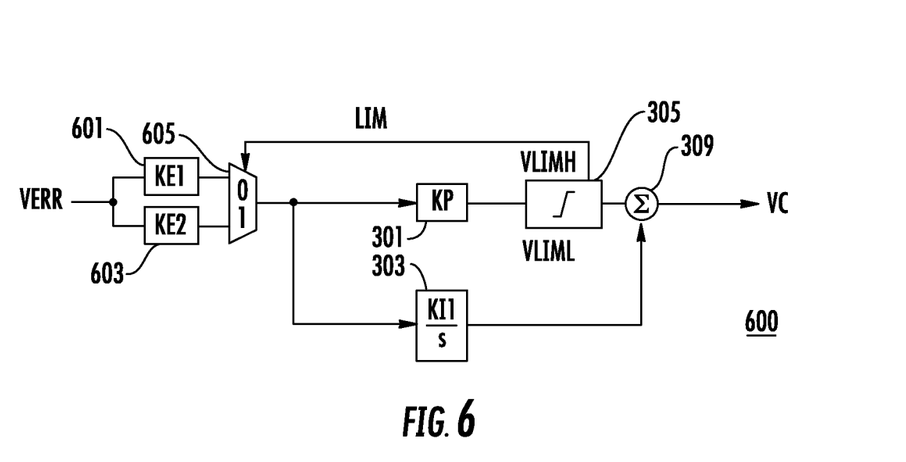
FIG. 6 is a block diagram illustrating a compensation system that may be used by the current mode controller of FIG. 2 to generate the control voltage based on the selected loop error signal according to another embodiment of the present invention.

FIG. 6 is a block diagram illustrating a compensation system 600 that may be used by the current mode controller 209 to generate the control voltage VC based on the error voltage VERR according to another embodiment of the present invention. VERR is provided to an input of a first gain circuit 601 with a gain KE1 and to the input of a booster gain circuit 603 with a second gain KE2. The output of the gain circuit 601 is provided to one input, or the logic "0" input, of a MUX 605. The output of the booster gain circuit 603 is provided to the logic "1" input of the MUX 605. The output of the MUX 605 is provided to the proportional gain circuit 301 and the integral gain circuit 303. The output of the proportional gain circuit 301 is provided to the input of the limit circuit 305, having an output providing a limited proportional gain signal to one input of the summing circuit 309 in similar manner as with the compensation system 300. The output of the integral gain circuit 303 provides an integral gain signal to the other input of the summing circuit 309, having its output providing the control voltage VC.

The limit circuit 305 operates in substantially similar manner by limiting the limited proportional signal to VLIML or VLIMH, except that when the limit condition is applied, it asserts a limit signal LIM to the control input of the MUX 605. In this case, the LIM signal is a logic or binary type signal indicating whether the limit function is being applied or not. When LIM is low indicating that the limit function is not applied, the gain circuit 601 with gain KE1 is selected, and when LIM is high indicating that the limit function is applied, the booster gain circuit 603 with gain KE2 is selected. In one embodiment, KE2>KE1 so that KE2 represents an increased or boosted gain during the limit function.

Operation of the compensation system 600 is similar to that of the compensation system 300. During normal operation for relatively slow or small changes of VERR, the limit circuit 305 does not perform the limit function and LIM is low. Thus, VERR is applied to the first gain circuit 601 applying the first gain KE1, and the result is applied to the gain circuits 301 and 303 in similar manner previously described. For a strong and/or fast change of VERR causing the limit circuit 305 to apply the limit function, LIM is asserted high. When LIM is asserted high, the MUX 605 selects the second gain circuit 603 to increase the gain to KE2. The increased gain in this case is applied to both the proportional gain KP and the integral gain KI1/s. The extra gain speeds up the control loop response and improves performance.

The transfer characteristics of the compensation system 600 of FIG. 6 to generate VC in response to a step increase of VERR is substantially the same as that shown in FIG. 4. As shown in FIG. 4, the lower graphic diagram depicts the step increase of VERR, and the upper graphic diagram illustrates the transfer characteristics of the compensation system 600 to generate VC in three different configurations. Although not explicitly shown, operation is similar to a large step decrease of VERR in the negative direction as previously described.

The first curve 401 illustrates the case when the limit circuit 305 is removed or otherwise bypassed and only the first gain KE1 of the first gain circuit 601 is applied. As shown by the curve 401, the response is strong and fast potentially leading to significant chatter and instability in response to the large step increase of VERR. The second curve 403 illustrates the case when the limit circuit 305 is provided, but the extra gain KE2 of the second gain circuit 603 is not applied (e.g., only the lower gain KE1 is applied). As shown by the curve 403, the response is muted providing a slow and somewhat unresponsive loop. Although chatter may be substantially eliminated, the loop response is slow and unable to sufficiently response to fast load transients.

The third curve 405 illustrates the case when both the limit circuit 305 and the second gain circuit 603, as selected by the MUX 605, are active in response to the large step increase of VERR. As shown by the curve 405, the initial response is limited by the limit circuit 305 in response to VERR. The limit circuit 305 mutes the initial response and asserts LIM, so that the second gain circuit 603 is selected and applies the larger gain KE2 to both the proportional gain KP and the integral gain KI1/s. In this case, the extra gain applied by KE2 speeds up the proportional and integral response relatively quickly resulting in a better response to the load transient or mode change. The initial response is partially muted to prevent instability and chatter, but then comes on strong sufficiently quickly to more accurately respond to the load step or mode change.

Figure 7:
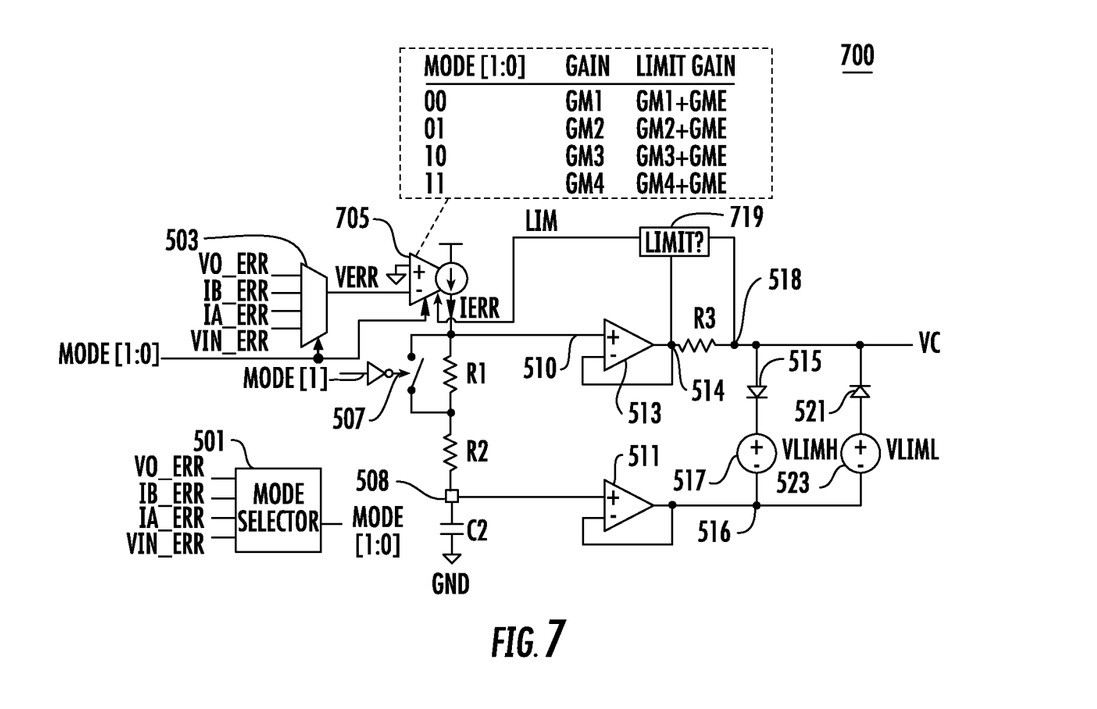
FIG. 7 is a schematic and block diagram illustrating a compensation circuit that implements the compensation system of FIG. 6 for generating the control voltage based on the selected loop error signal according to one embodiment.

FIG. 7 is a schematic and block diagram illustrating a compensation circuit 700 that implements the compensation system 600 of FIG. 6 for generating VC based on VERR according to one embodiment. The compensation circuit 700 is similar to the compensation circuit 500, in which similar devices performing similar functions assume the same reference numerals. As shown, the mode selector 501 generating the MODE[1:0] signal, the select logic 503 for selecting one of the mode error signals VO_ERR, IB_ERR, IA_ERR, and VIN_ERR as VERR, the resistors R1 and R2 coupled in series between summing node 510 and integral node 508, the capacitor C2 coupled between node 508 and GND, the inverted switch circuit 507 for selectively bypassing R1, the buffer amplifier 511 driving buffered integral node 516 as a buffered version of the voltage of integral node 508, the buffer amplifier 513 with input from summing node 510 and driving the buffered summing node 514, the resistor R3 coupled between nodes 514 and 518, and the limit circuit including the diodes 515 and 521 and the voltage sources 517 and 523 developing VLIMH and VLIML, respectively, are included and coupled to operate in substantially similar manner.

In this case, the transconductance amplifier 519 is replaced by a limit detector 719 that applies LIM as a logical or binary limit signal to a gain input of a transconductance amplifier 705, which replaces the transconductance amplifier 505. The limit detector 719 has inputs coupled to nodes 514 and 518 and an output providing the LIM signal. The limit detector 719 detects when the voltage of the node 518 is being limited by the limit circuit relative to node 514, and when the limit function is being applied (either positive or negative), it asserts LIM. The error amplifier 705 operates in a similar manner to generate the error current IERR based on VERR, in which IERR is injected into node 510 through the resistors R1 (unless bypassed) and R2 and the capacitor C2. When LIM is not asserted, the error amplifier 705 operates the same as the error amplifier 505 with substantially the same gains GM1-GM4 for the corresponding control modes of operation depending upon the selected mode indicated by the MODE[1:0] signal as previously described. However, when LIM is asserted indicating that the limit function is active, an extra gain factor GME is added by the error amplifier 705 to boost the magnitude of IERR.

In particular, in the first mode (MODE[1:0]=00b), the normal gain is GM1 and the new gain is GM1+GME when LIM is asserted indicating that the limit function is being applied. Similarly, in the second mode (MODE[1:0]=01b), the normal gain is GM2 and the new gain is GM2+GME when LIM is asserted, in the third mode (MODE[1:0]=10b), the normal gain is GM3 and the new gain is GM3+GME when LIM is asserted, and in the fourth mode (MODE[1:0]=11b), the normal gain is GM4 and the new gain is GM4+GME when LIM is asserted. The operation of the error amplifier 705 to boost the gain function when LIM is asserted during the limit condition implements the function of the first and second gain circuits 601 and 603 and the MUX 605 of FIG. 6. The added gain GME implements the addition of the larger gain factor KE2 (relative to KE1) when the limit function is applied. Note that since GME is added to boost the magnitude of IERR during the limit condition, the added gain applies to both the integral gain factor implemented by IERR charging the capacitor C2, and to the proportional gain factor implemented by IERR flowing through one or both of the resistors R1 and R2. The gains are added to boost the voltage of the node 510.

Operation of the compensation circuit 700 is similar to that of the compensation circuit 500. Again, the loop selector 211 receives signals VIN, IA, VO and IB (or sensed versions thereof), develops each of the error signals VO_ERR, IB_ERR, IA_ERR and VIN_ERR, and controls the mode selector 501 to provide the MODE[1:0] signal based on the selected mode of operation. MODE[1:0] controls the select logic 503 to select one of the error signals VO_ERR, IB_ERR, IA_ERR and VIN_ERR as the selected error signal VERR for controlling the loop. The MODE[1:0] signal also adjusts the gain of the error amplifier 705 based on the selected mode of operation. In this case, however, the gain of the error amplifier 705 is a selected one of gains GM1–GM4 when LIM is low, or is a selected one of gains GM1+GME, GM2+GME, GM3+GME, or GM4+GME when LIM is high. The error amplifier 705 drives IERR based on VERR and the selected gain to develop the voltage on node 510, which is buffered (and possibly limited) to develop the control voltage VC to control the loop.

When changes of VERR are relatively slow, then the voltage on node 518 stays within VLIMH and VLIML of the voltage on node 516 so that the limit function does not apply and the limit detector 719 does not assert LIM. In response to a fast change of VERR, such as the step function shown in FIG. 4 (positive or negative), the voltage of node 514 jumps beyond the voltage of node 516 by more than VLIMH or VLIML, one of the diodes 515 or 521 is forward biased to clamp the voltage of VC relative to node 516, and the limit detector 719 asserts LIM to boost the gain of the error amplifier 705 by GME. The boosted gain adjusts IERR to speed up both the proportional gain and the integral gain. As the voltages of nodes 516 and 518 change due to the additional gain, the response to the step change of VERR is faster and more responsive.

Similar to that of the compensation circuit 500, test results of the compensation circuit 700 reveal the improvements in operation when the limit function and corresponding gain is added. In the non-limited case, the limit function performed by the diodes 515 and 521 and the voltage sources 517 and 523 are removed (or otherwise shorted), and the limit detector 719 is removed such that the gain of the error amplifier 705 is not boosted. The test results reveal substantial oscillation that results in a significant amount of chatter and instability in the system in response to the large step change of VERR. When the limit circuit including the diodes 515 and 521 and the voltage sources 517 and 523 are added but without gain boost of the error amplifier 705, test results illustrate a relatively slow response in which the output voltage VO changes significantly and the adapter current IA is slow to respond. Although oscillation has been virtually eliminated, the delay of VC and IA and the output voltage offset of VO are disadvantageous. Finally, for the limited and increased gain case (proportional and integral gain increase) in which the diodes 515 and 521 and the voltage sources 517 and 523 are included, and the limit detector 719 detects the limit function to boost the gain of the error amplifier 705, test results reveal a relatively fast response for VC, VO and IA without significant change of the output voltage VO. In this manner, the compensation circuit 700 provides high speed nonlinear compensation to improve the overall response of the regulator 111.

Figure 8:
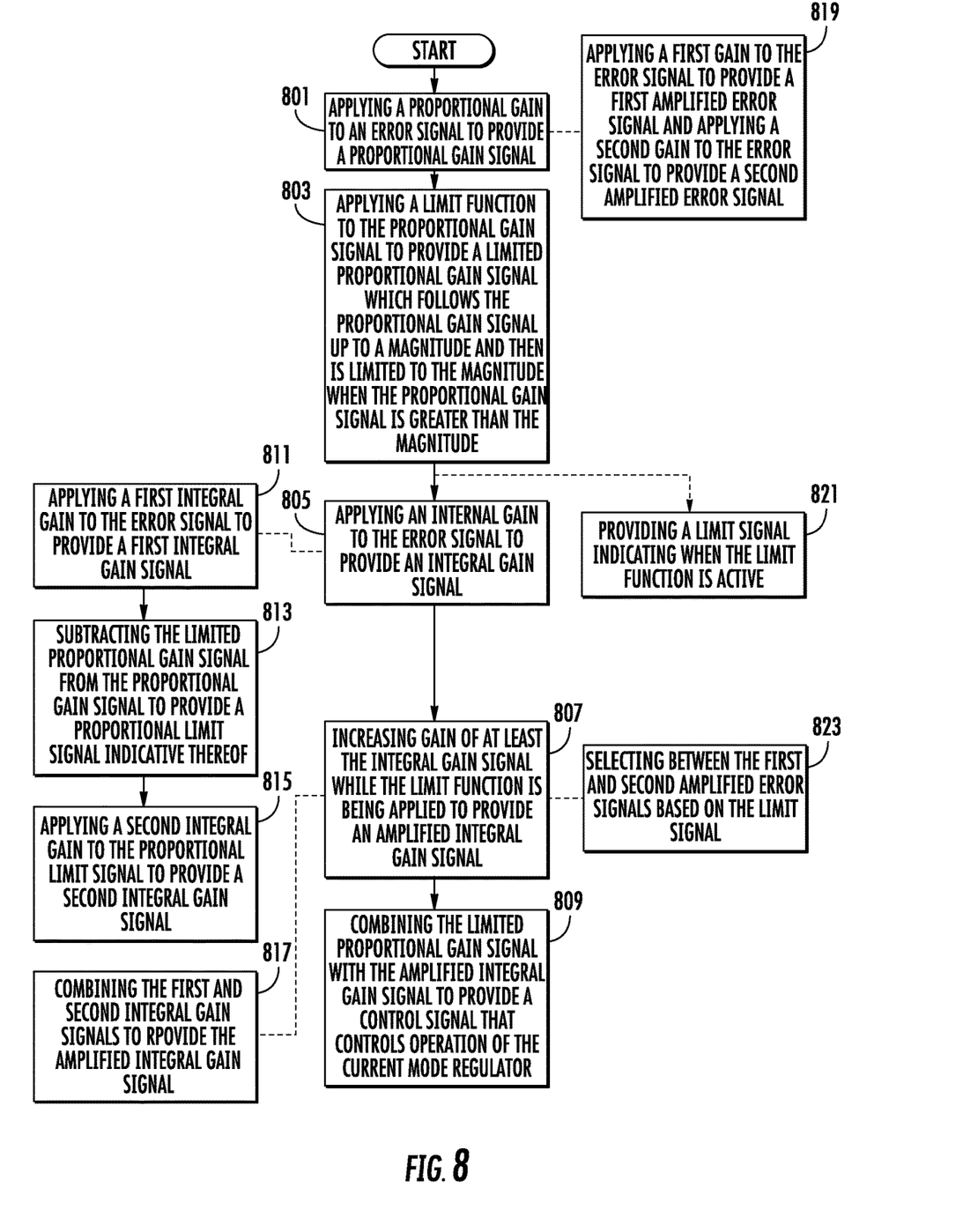
FIG. 8 is a flowchart diagram illustrating operation of the various embodiments described herein.

FIG. 8 is a flowchart diagram illustrating operation of the various embodiments described herein. At a first block 801, a proportional gain is applied to an error signal to provide a proportional gain signal. At next block 803, a limit function is applied to the proportional gain signal to provide a limited proportional gain signal. The limited proportional gain signal follows the proportional gain signal up to a magnitude and then is limited to the magnitude when the proportional gain signal is greater than the magnitude. At next block 805, an integral gain is applied to the error signal to provide an integral gain signal. At next block 807, the gain of at least the integral gain signal is increased while the limit function is being applied to provide an amplified integral gain signal. At a next block 809, the limited proportional gain signal is combined with the amplified integral gain signal to provide a control signal (e.g., VC) that controls operation of the current mode regulator.

The method may be modified for more specific embodiments. For the compensation system 300 shown in FIG. 3, block 805 is may be described as applying a first integral gain to the error signal to provide a first integral gain signal as shown at block 811. Additional steps include block 813, in which the limited proportional gain signal is subtracted from the proportional gain signal to provide a proportional limit signal indicative thereof, and next block 815 in which a second integral gain is applied to the proportional limit signal to provide a second integral gain signal. Block 807 may be replaced by block 817, in which the first and second integral gain signals are combined to provide the amplified integral gain signal. Block 809 is then performed to complete the process.

For the compensation system 600 shown in FIG. 6, block 801 is replaced by block 819 in which a first gain is applied to the error signal to provide a first amplified error signal and a second gain is applied to the error signal to provide a second amplified error signal. After block 803, a block 821 is included in which a limit signal is provided indicating when the limit function is active. Block 807 is replaced by block 823, in which the one of the first and second amplified error signals are selected based on the limit signal. For example, the second gain used to provide the second amplified error signal may be greater than the first gain used to provide the first amplified error signal.

Modifications or variations are contemplated. The limit function, for example, may be unidirectional such as applied only to increases of VERR and not decreases of VERR, meaning only gain limit in the positive direction. Thus, the limit circuit 305 may apply only the high limit VLIMH and not the low limit VLIML. In the compensation circuits 500 and 700, the diode 521 and the voltage source 523 may be removed to eliminate the negative limit function so that only the positive limit function is used. In such embodiments, any oscillations or temporary instability caused by fast decrease of load may be considered tolerable.

The benefits, features, and advantages of the present invention are now better understood with regard to the foregoing description and accompanying drawings. The foregoing description was presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed. Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention as defined by the following claim(s).

What is claimed is:

1. An apparatus, comprising:
   a proportional gain circuit that applies a proportional gain to an error signal to provide a proportional gain signal;
   an integral gain circuit that applies an integral gain to the error signal to provide an integral gain signal;
   a limit circuit that provides a limited proportional gain signal that follows the proportional gain signal up to a magnitude and that applies a limit function to limit the limited proportional gain signal to the magnitude while a magnitude of the proportional gain signal is greater than the magnitude;
   a gain booster circuit that is configured to function to only increase gain of at least the integral gain signal while the limit function is applied, such that the gain booster circuit is not operative to increase gain of the at least the integral gain signal when the limit function is not applied; and
   a combiner that combines the limited proportional gain signal with the integral gain signal to provide a control signal on a control node that controls operation of a regulator.

2. The apparatus of claim 1, wherein:
   the limit circuit comprises an adder that subtracts the limited proportional gain signal from the proportional gain signal to provide a proportional limit signal indicative thereof;
   wherein the integral gain circuit comprises a first integral gain circuit that applies a first integral gain to the error signal to provide a first integral gain signal;
   wherein the gain booster circuit comprises a second integral gain circuit that applies a second integral gain to the proportional limit signal to provide a second integral gain signal; and
   further comprising a summing circuit that combines the first and second integral gain signals to provide the integral gain signal.

3. The apparatus of claim 1, wherein the gain booster circuit increases a gain of the error signal while the limit function is applied.

4. The apparatus of claim 1, wherein:
   the limit circuit asserts a limit signal indicating whether the limit function is active; and
   wherein the gain booster circuit comprises:
     a first gain circuit that applies a first gain to the error signal to provide a first amplified error signal;
     a second gain circuit that applies a second gain to the error signal to provide a second amplified error signal; and
     a select circuit that selects between the first and second amplified error signals based on the limit signal.

5. The apparatus of claim 1, wherein:
   the proportional gain circuit, the integral gain circuit and the combiner comprises:
     a resistor circuit coupled between a summing node and an integral node;
     a capacitor circuit coupled between the integral node and a reference node;
     a first transconductance amplifier having an input receiving the error signal and an output that provides a current signal indicative thereof to the summing node;
     a first buffer amplifier having an input coupled to the integral node and having an output providing the integral gain signal to a buffered integral node;
     a second buffer amplifier having an input coupled to the summing node and having an output providing the proportional gain signal to a buffered summing node; and
     a resistive device coupled between the buffered summing node and the control node; and
   wherein the limit circuit comprises a clamp circuit coupled between the buffered integral node and the control node.

6. The apparatus of claim 5, wherein the clamp circuit prevents a voltage of the control node from rising above a voltage of the buffered integral node by an upper limit amount.

7. The apparatus of claim 5, wherein the clamp circuit comprises:
   a first clamp circuit that prevents a voltage of the control node from rising above a voltage of the buffered integral node by an upper limit amount; and
   a second clamp circuit that prevents a voltage of the control node from falling below a voltage of the buffered integral node by a lower limit amount.

8. The apparatus of claim 7, wherein the first and second clamp circuits each comprise a diode and a voltage source.

9. The apparatus of claim 5, wherein the gain booster circuit comprises a second transconductance amplifier having a first input coupled to the summing node, having a second input coupled to the control node and having an output coupled to the integral node.

10. The apparatus of claim 5, wherein:
    the limit circuit further comprises a limit detector having inputs coupled to the buffered summing node and the control node and having an output that asserts a limit signal indicating whether the limit function is active; and
    wherein the first transconductance amplifier has a gain adjust input receiving the limit signal, wherein the first transconductance amplifier increases gain applied to the error signal when the limit signal indicates that the limit function is active.

11. The apparatus of claim 5, further comprising select logic that selects from among a plurality of loop error signals to provide the error signal to the first transconductance amplifier.

12. The apparatus of claim 11, further comprising a loop selector that monitors the plurality of loop error signals including an input voltage error, an output voltage error, an input current error and a battery current error, and that controls the select logic.

13. The apparatus of claim 12, further comprising wherein the proportional gain circuit, the integral gain circuit, the limit circuit, the gain booster circuit, and the combiner form a compensation circuit provided within a current mode controller of a regulator, wherein the current mode controller receives the error signal and an inductor current signal and develops a pulse width modulation signal for controlling the regulator and that develops a battery control signal for controlling a battery current.

14. An electronic device, comprising:
a system load;
an input node for receiving an adapter voltage and for developing an input voltage;
a battery node for receiving a battery voltage;
a regulator coupled to the input node and the battery node and that provides an output voltage to the system load, the regulator comprising:
a converter that converts the input voltage to the output voltage based on a pulse control signal;
a loop selector that monitors a plurality of loop error signals including an input voltage error, an output voltage error, an input current error and a battery current error, and that selects one of the plurality of loop error signals to provide a selected error signal;
a current mode controller that monitors the selected error signal and a current through the converter and that develops the pulse control signal, wherein the current mode controller comprises:
a proportional gain circuit that applies a proportional gain to the selected error signal to provide a proportional gain signal;
an integral gain circuit that applies an integral gain to the selected error signal to develop an integral gain signal;
a limit circuit that provides a limited proportional gain signal that follows the proportional gain signal up to a magnitude and that applies a limit function to limit the limited proportional gain signal to the magnitude while a magnitude of the proportional gain signal is greater than the magnitude;
a gain booster circuit that increases gain of at least the integral gain signal while the limit function is applied; and
a combiner that combines the limited proportional gain signal with the integral gain signal to provide a control signal on a control node used to develop the pulse control signal.

15. The electronic device of claim 14, wherein:
the integral gain circuit comprises a first amplifier that applies a current error signal proportional to the selected error signal to a capacitor that develops an integral gain voltage; and
wherein the gain booster circuit comprises a second amplifier that converts a voltage difference between the proportional gain signal and the limited proportional gain signal into a gain boost current that is applied to the capacitor.

16. The electronic device of claim 14, wherein:
the loop selector provides a mode signal indicative of the selected one of the plurality of loop error signals;
wherein the integral gain circuit comprises an amplifier that applies a current error signal proportional to the selected error signal to a capacitor that develops an integral gain voltage;
wherein the amplifier selects from among a plurality of different gains applied to the current error signal based on the mode signal, and wherein the amplifier comprises a limit input that receives a limit signal and that further boosts gain of the current error signal when the limit signal indicates a limit condition; and
wherein the gain booster circuit comprises a limit detector that detects the limit function when the proportional gain signal has a greater magnitude than the limited proportional gain signal and that provides the limit signal indicative thereof.

17. A method of controlling a current mode regulator, comprising:
applying a proportional gain to an error signal to provide a proportional gain signal;
applying a limit function to the proportional gain signal to provide a limited proportional gain signal which follows the proportional gain signal up to a magnitude and then is limited to the magnitude when the proportional gain signal is greater than the magnitude;
applying an integral gain to the error signal to provide an integral gain signal;
increasing gain of at least the integral gain signal only during a duration of time in which the limit function is being applied to provide an amplified integral gain signal; and
combining the limited proportional gain signal with the amplified integral gain signal to provide a control signal that controls operation of the current mode regulator.

18. The method of claim 17, wherein the applying an integral gain to the error signal comprises applying a first integral gain to the error signal to provide a first integral gain signal, wherein the method further comprises:
subtracting the limited proportional gain signal from the proportional gain signal to provide a proportional limit signal indicative thereof;
applying a second integral gain to the proportional limit signal to provide a second integral gain signal; and
wherein the increasing gain of at least the integral gain signal while the limit function is being applied comprises combining the first and second integral gain signals to provide the amplified integral gain signal.

19. The method of claim 17, further comprising:
providing a limit signal indicating when the limit function is active; and
wherein the applying a proportional gain and the increasing gain comprises:
applying a first gain to the error signal to provide a first amplified error signal;
applying a second gain to the error signal to provide a second amplified error signal; and
selecting between the first and second amplified error signals based on the limit signal.

20. The method of claim 17, wherein the increasing gain comprises increasing a gain applied to the error signal while the limit function is applied.

* * * * *